US010249670B2

(12) United States Patent
Seko

(10) Patent No.: US 10,249,670 B2
(45) Date of Patent: Apr. 2, 2019

(54) SOLID-STATE IMAGING DEVICE AND ELECTRONIC APPARATUS WITH MULTIPLE LAYERS OF SIGNAL LINES AND INTERCONNECT LINES

(71) Applicant: SONY CORPORATION, Tokyo (JP)

(72) Inventor: Hiroaki Seko, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/110,573

(22) PCT Filed: Jan. 9, 2015

(86) PCT No.: PCT/JP2015/050435
§ 371 (c)(1),
(2) Date: Jul. 8, 2016

(87) PCT Pub. No.: WO2015/111446
PCT Pub. Date: Jul. 30, 2015

(65) Prior Publication Data
US 2016/0336371 A1    Nov. 17, 2016

(30) Foreign Application Priority Data
Jan. 22, 2014   (JP) ................................ 2014-009182

(51) Int. Cl.
*H01L 23/522*    (2006.01)
*H01L 27/146*    (2006.01)

(52) U.S. Cl.
CPC .... *H01L 27/14634* (2013.01); *H01L 27/1464* (2013.01); *H01L 27/14636* (2013.01);
(Continued)

(58) Field of Classification Search
None
See application file for complete search history.

(56) References Cited

U.S. PATENT DOCUMENTS

| | | | |
|---|---|---|---|
| 2009/0200631 A1* | 8/2009 | Tai | H01L 27/1462 257/435 |
| 2012/0105696 A1* | 5/2012 | Maeda | H01L 21/76898 348/302 |
| 2013/0068929 A1* | 3/2013 | Solhusvik | H01L 27/14634 250/208.1 |

FOREIGN PATENT DOCUMENTS

| | | |
|---|---|---|
| CN | 102629616 | 8/2012 |
| JP | 5-160278 A | 6/1993 |

(Continued)

OTHER PUBLICATIONS

International Search Report prepared by the Japanese Patent Office dated Mar. 31, 2015, for International Application No. PCT/JP2015/050435.
(Continued)

*Primary Examiner* — Justin P. Misleh
(74) *Attorney, Agent, or Firm* — Sheridan Ross P.C.

(57) ABSTRACT

The present disclosure relates to a solid-state imaging device that can reduce crosstalk interference, and to an electronic apparatus. In the upper chip, VSLs, VSLs, and control lines are stacked in this order from the bottom. That is, in the stacked solid-state imaging device, the control lines are laid out in the uppermost layer of the upper chip. In this structure, the influence of a lower chip on the two sets of VSLs can be shielded by the control lines. The present disclosure can be applied to CMOS solid-state imaging devices to be used in electronic apparatuses, such as a camera apparatus.

12 Claims, 11 Drawing Sheets

(52) U.S. Cl.
CPC .... *H01L 27/14638* (2013.01); *H01L 23/5225* (2013.01); *H01L 2924/0002* (2013.01)

(56) References Cited

FOREIGN PATENT DOCUMENTS

| | | | |
|---|---|---|---|
| JP | 05160278 A | * | 6/1993 |
| JP | 2011-114843 A | | 6/2011 |
| JP | 2012-83739 A | | 5/2012 |
| JP | 2012-089739 A | | 5/2012 |
| JP | 2012-164870 A | | 8/2012 |

OTHER PUBLICATIONS

Official Action (with English translation) for Chinese Patent Application No. 201580003307.X, dated Aug. 3, 2018, 14 pages.

* cited by examiner

SOLID-STATE IMAGING DEVICE AND ELECTRONIC APPARATUS WITH MULTIPLE LAYERS OF SIGNAL LINES AND INTERCONNECT LINES

CROSS REFERENCE TO RELATED APPLICATIONS

This application is a national stage application under 35 U.S.C. 371 and claims the benefit of PCT Application No. PCT/JP2015/050435 having an international filing date of 9 Jan. 2015, which designated the United States, which PCT application claimed the benefit of Japanese Patent Application No. 2014-009182 filed 22 Jan. 2014, the disclosures of which are incorporated herein by reference in their entirety.

TECHNICAL FIELD

The present disclosure relates to solid-state imaging devices and electronic apparatuses. More particularly, the present disclosure relates to a solid-state imaging device that can reduce crosstalk interference without an increase in the number of procedures, and to an electronic apparatus.

BACKGROUND ART

In a stacked solid-state imaging device, crosstalk interference often occurs between upper and lower elements. To counter this problem, Patent Document 1 discloses a technique by which a metal layer is formed and joined to the uppermost layer of each of the elements to be stacked, and the metal layer is made to function as a shielding layer to reduce crosstalk between the upper and lower elements.

CITATION LIST

Patent Document

Patent Document 1: Japanese Patent Application Laid-Open No. 2012-94720

SUMMARY OF THE INVENTION

Problems to be Solved by the Invention

By the above described method, a metal layer is formed on each of the upper and lower chips as the measure against crosstalk interference to be generated between the upper and lower elements. By this method, however, the number of procedures becomes larger.

The present disclosure is being made in view of those circumstances, and aims to reduce crosstalk interference without an increase in the number of procedures.

Solutions to Problems

A solid-state imaging device as one aspect of the present technology includes: a pixel chip; and a logic chip stacked on the pixel chip. In the pixel chip, first interconnect lines are laid out in a layer above vertical signal lines, the first interconnect lines being other than the vertical signal lines.

The vertical signal lines are laid out in two or more layers.

Second interconnect lines are laid out in a layer below the vertical signal lines in the lowermost layer among the vertical signal lines, the second interconnect lines being other than the vertical signal lines.

The vertical signal lines laid out in the two or more layers differ in at least one of line width and thickness.

The solid-state imaging device may further include interconnect interlayer insulating films having different permittivities.

The permittivities are adjusted in accordance with the distances from the logic chip.

The permittivity at a greater distance from the logic chip is adjusted to a greater value.

The solid-state imaging device is formed with a back-illuminated imaging device.

The first interconnect lines are control lines, ground lines, or power supply lines.

The second interconnect lines are ground lines or power supply lines.

An electronic apparatus as one aspect of the present technology includes: a solid-state imaging device including a pixel chip and a logic chip stacked on the pixel chip, in the pixel chip, first interconnect lines being laid out in a layer above vertical signal lines, the first interconnect lines being other than the vertical signal lines; a signal processing circuit that processes a signal output from the solid-state imaging device; and an optical system that emits light entering the solid-state imaging device.

The vertical signal lines are laid out in two or more layers.

Second interconnect lines are laid out in a layer below the vertical signal lines in the lowermost layer among the vertical signal lines, the second interconnect lines being other than the vertical signal lines.

The vertical signal lines laid out in the two or more layers differ in at least one of line width and thickness.

The electronic apparatus may further include interconnect interlayer insulating films having different permittivities.

The permittivities are adjusted in accordance with the distances from the logic chip.

The permittivity at a greater distance from the logic chip is adjusted to a greater value.

The electronic apparatus is formed with a back-illuminated imaging device.

The first interconnect lines are control lines, ground lines, or power supply lines.

The second interconnect lines are ground lines or power supply lines.

In one aspect of the present technology, a pixel chip and a logic chip stacked on the pixel chip are provided. In the pixel chip, first interconnect lines other than vertical signal lines are laid out in a layer above vertical signal lines.

Effects of the Invention

According to the present technology, crosstalk interference can be reduced.

The advantageous effects described in this specification are merely examples, and the advantageous effects of the present technology are not limited to them and may include some additional effects.

MODES FOR CARRYING OUT THE INVENTION

The following is a description of modes for carrying out the present disclosure (hereinafter referred to as the embodiments). Explanation will be made in the following order.

0. General example structure of a solid-state imaging device

1. First embodiment: an example of a solid-state imaging device

2. Second embodiment: an example of an electronic apparatus

<0. General Example Structure of a Solid-State Imaging Device>

<General Example Structure of a Solid-State Imaging Device>

Figure 1:
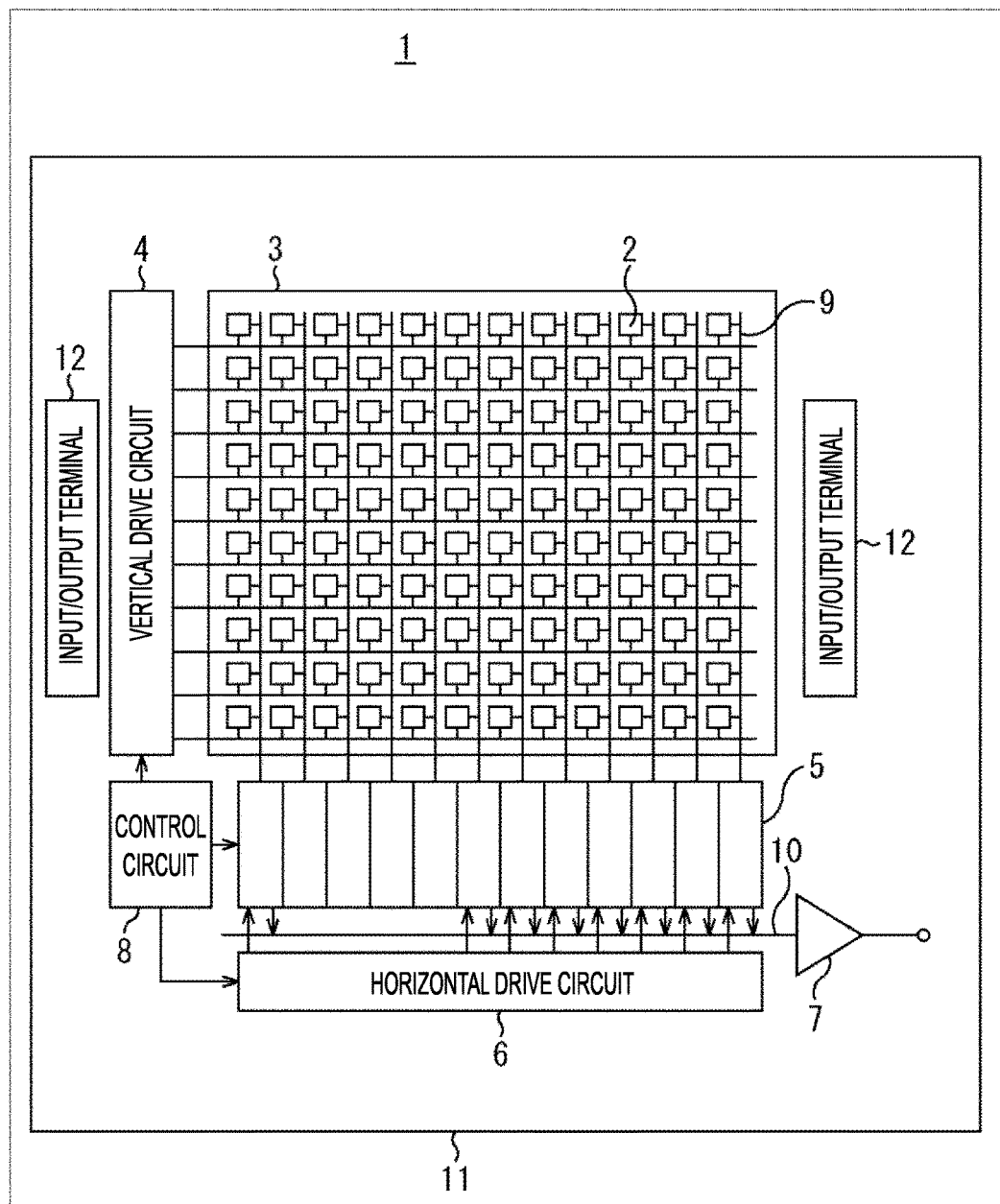
FIG. 1 is a block diagram schematically showing an example structure of a solid-state imaging device to which the present technology is applied.

FIG. 1 shows a general example structure of a complementary metal oxide semiconductor (CMOS) solid-state imaging device to be applied in each embodiment of the present technology.

As shown in FIG. 1, a solid-state imaging device (a component chip) 1 includes a pixel region (or an imaging area) 3 and a peripheral circuit unit. In the pixel region 3, pixels 2 each having a photoelectric conversion element are two-dimensionally arranged with regularity on a semiconductor substrate 11 (a silicon substrate, for example).

A pixel 2 includes a photoelectric conversion element (a photodiode, for example) and pixel transistors (or MOS transistors). The pixel transistors may be formed with the three transistors consisting of a transfer transistor, a reset transistor, and an amplifying transistor, or may be formed with four transistors further including a select transistor. The equivalent circuit of each pixel 2 (unit pixel) is the same as a general one, and therefore, is not described in detail herein.

Alternatively, the pixels 2 may be a sharing pixel structure. The pixel sharing structure includes photodiodes, transfer transistors, one shared floating diffusion, and each shared one of other pixel transistors.

The peripheral circuit unit includes a vertical drive circuit 4, column signal processing circuits 5, a horizontal drive circuit 6, an output circuit 7, a control circuit 8.

The control circuit 8 receives an input clock and data that designates an operation mode and the like, and also outputs data such as internal information about the solid-state imaging device 1. Specifically, in accordance with a vertical synchronization signal, a horizontal synchronization signal, and a master clock, the control circuit 8 generates a clock signal and a control signal that serve as the references for operations of the vertical drive circuit 4, the column signal processing circuits 5, and the horizontal drive circuit 6. The control circuit 8 then inputs these signals to the vertical drive circuit 4, the column signal processing circuits 5, and the horizontal drive circuit 6.

The vertical drive circuit 4 is formed with a shift register, for example. The vertical drive circuit 4 selects a pixel drive line, supplies a pulse for driving the pixels 2 connected to the selected pixel drive line, and drives the pixels 2 on a row-by-row basis. Specifically, the vertical drive circuit 4 sequentially selects and scans the respective pixels 2 in the pixel region 3 on a row-by-row basis in the vertical direction, and supplies pixel signals based on signal charges generated in accordance with the amounts of light received in the photoelectric conversion elements of the respective pixels 2, to the column signal processing circuits 5 through vertical signal lines 9.

The column signal processing circuits 5 are provided for the respective columns of the pixels 2, for example, and perform signal processing such as denoising, on a column-by-column basis, on signals that are output from the pixels 2 of one row. Specifically, the column signal processing circuits 5 perform signal processing, such as correlated double sampling (CDS) for removing fixed pattern noise inherent to the pixels 2, signal amplification, and analog/digital (A/D) conversion. Horizontal select switches (not shown) are provided between and connected to the output stages of the column signal processing circuits 5 and a horizontal signal line 10.

The horizontal drive circuit 6 is formed with a shift register, for example. The horizontal drive circuit 6 sequentially selects the respective column signal processing circuits 5 by sequentially outputting horizontal scan pulses, and causes the respective column signal processing circuits 5 to output pixel signals to the horizontal signal line 10.

The output circuit 7 performs signal processing on signals sequentially supplied from the respective column signal processing circuits 5 through the horizontal signal line 10, and outputs the processed signals. The output circuit 7 might perform only buffering, or might perform black level control, column variation correction, and various kinds of digital signal processing, for example.

Input/output terminals 12 are provided to exchange signals with the outside.

Figure 2:
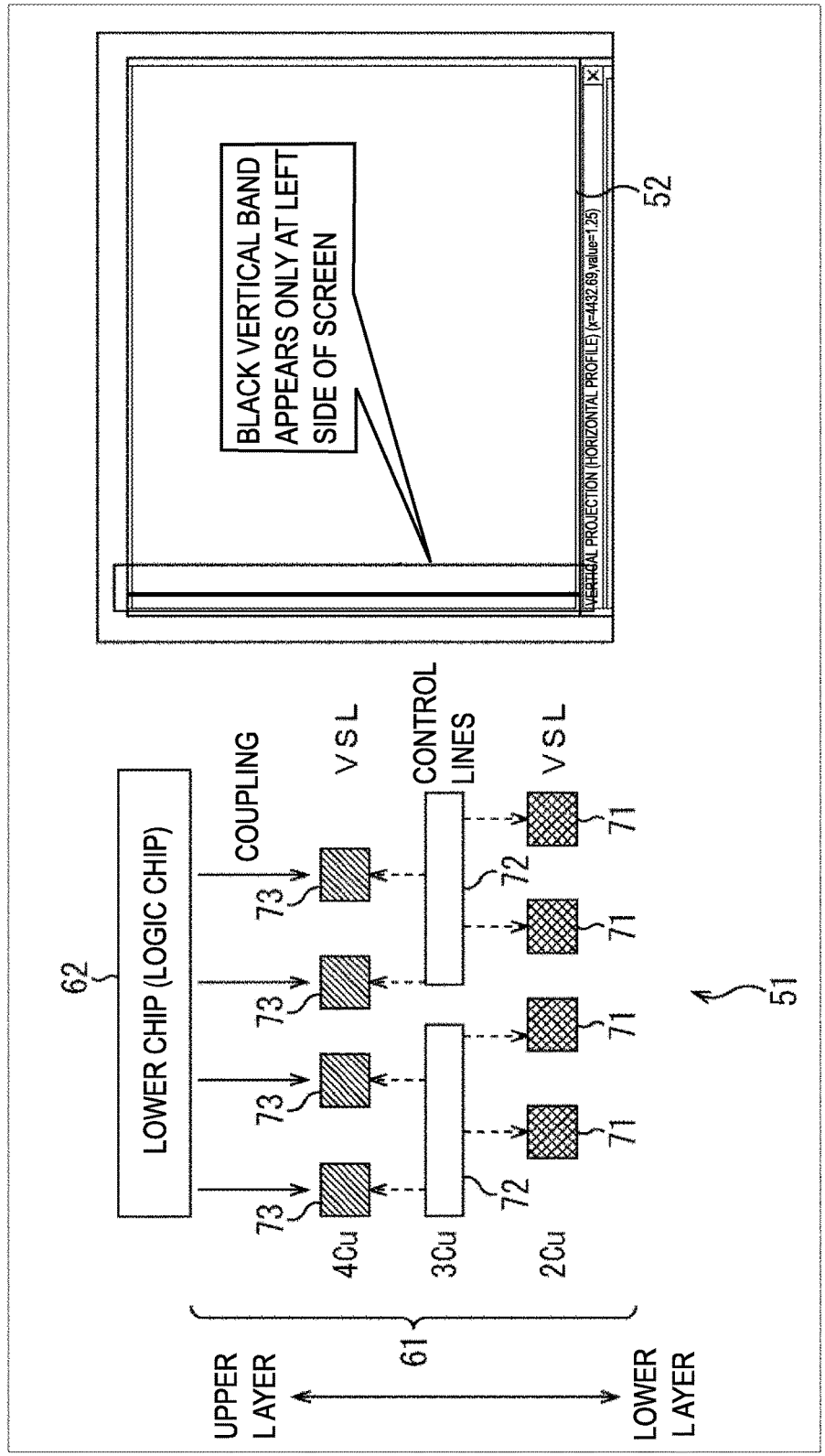
FIG. 2 is a cross-sectional view of an example structure of a solid-state imaging device.

Referring now to FIG. 2, pixel characteristics degradation due to crosstalk interference is described.

A solid-state imaging device 51 is of a stacked type. In the solid-state imaging device 51, a lower chip 62 that is a logic chip is stacked on an upper chip 61 that is a pixel chip. In the upper chip 61, vertical signal lines (VSLs) 71, interconnect lines 72 other than VSLs, such as control lines, power supply lines, and ground (GND) lines (the interconnect lines 72 will be hereinafter referred to as the control lines 72), and VSLs 73 are stacked in this order from the bottom. In the drawing, 2Cu, 3Cu, and 4Cu denote the second interconnect layer from the bottom, the third interconnect layer from the bottom, and the fourth interconnect layer from the bottom, respectively. That is, in the stacked solid-state imaging device 51, the VSLs 73 are laid out in the uppermost layer of the upper chip 61.

In this case, a black vertical band or the like appears due to crosstalk from the lower chip 62, as shown at the left side of a screen 52, and the imaging characteristics of the pixel chip degrade. This is the mechanism in which the imaging characteristics are adversely affected by crosstalk and thus degrade during the A/D conversion period while the VSLs are in a floating state.

In view of the above, the present technology aims to reduce crosstalk interference by laying out the interconnect lines other than the VSLs, such as control lines and power supply lines, in a layer located above the vertical signal lines (VSLs) in the pixel chip.

1. First Embodiment

<Example Structure of a Solid-State Imaging Device>

Figure 3:
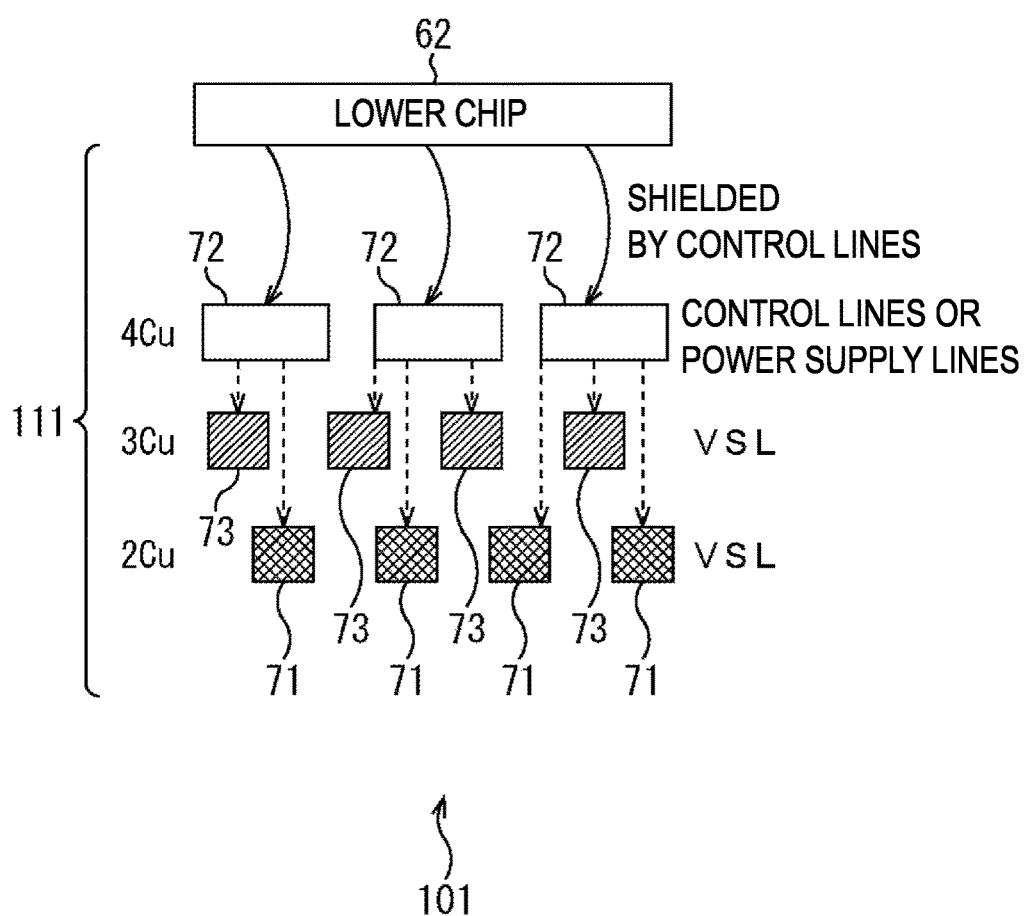
FIG. 3 is a cross-sectional view of a first example structure of a solid-state imaging device to which the present technology is applied.

FIG. 3 is a cross-sectional view of an example structure of a solid-state imaging device to which the present technology is applied.

The solid-state imaging device 101 in FIG. 3 is the same as the solid-state imaging device 51 in FIG. 2 in including the lower chip 62. The solid-state imaging device 101 in FIG. 3 differs from the solid-state imaging device 51 in FIG. 2 in that the upper chip 61 is replaced with an upper chip 111.

In the upper chip 111, VSLs 71, VSLs 73, and control lines 72 are stacked in this order from the bottom. That is, in the stacked solid-state imaging device 101, the control lines 72 are laid out in the uppermost layer of the upper chip 111.

In this structure, the influence of the lower chip 62 on the VSLs 71 and the VSLs 73 can be shielded by the control lines 72.

Although the example structure shown in FIG. 3 includes the two layers formed with the VSLs 71 and the VSLs 73, the present technology can also be applied in cases where the VSLs are laid out in one layer.

However, in a case where the VSLs are laid out in two or more layers so as to reduce VSL load capacitance as in the solid-state imaging device 101, the distance from the control lines 72 varies between the VSLs 71 and the VSLs 73 as indicated by the dashed lines in FIG. 3, and therefore, a difference is caused in VSL load capacitance.

In view of this, as shown in the upper chip 161 of the solid-state imaging device 151 shown in FIG. 4, interconnect lines 162 such as ground lines or power supply lines in 1Cu are laid out immediately below the VSLs 71. With this, the capacitance difference between the VSLs 71 and the VSLs 73 can be reduced, as shown in FIG. 5.

Figure 4:
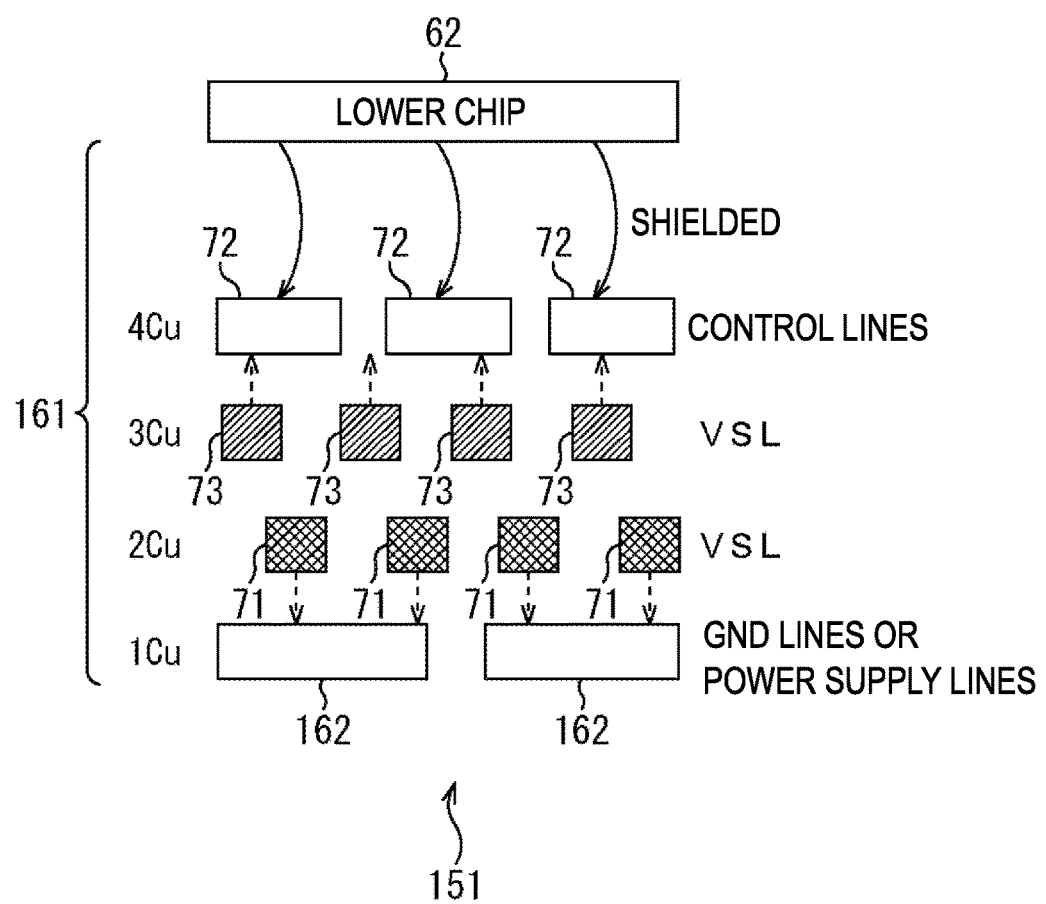
FIG. 4 is a cross-sectional view of a second example structure of a solid-state imaging device to which the present technology is applied.
Figure 5:
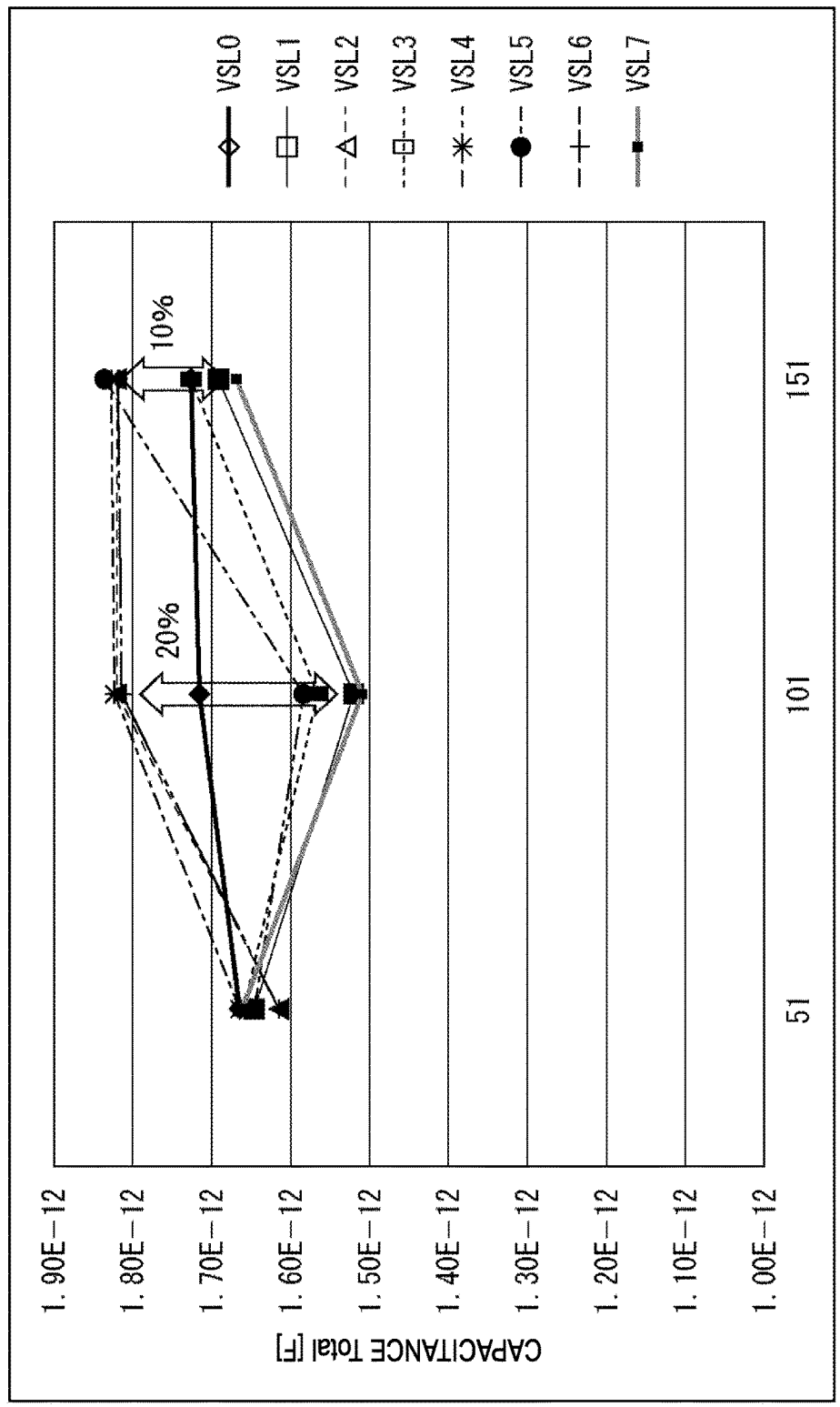
FIG. 5 is a graph for comparing VSL load capacitance differences.

FIG. 5 shows a graph for comparing the VSL load capacitance differences among the solid-state imaging device 51 shown in FIG. 2, the solid-state imaging device 101 shown in FIG. 3, and the solid-state imaging device 151 shown in FIG. 4.

In the graph, the ordinate axis indicates capacitance Total [F]. For example, VSL0, VSL2, VSL4, and VSL6 in the graph are equivalent to the VSLs 73, and VSL1, VSL3, VSL5, and VSL7 in the graph are equivalent to the VSLs 71.

In the solid-state imaging device 51, the control lines 72 are laid out between the VSLs 71 and the VSLs 73, and therefore, there is hardly a difference between the VSLs 71 and the VSLs 73. In the solid-state imaging device 101, on the other hand, there is a 20% load capacitance difference between the VSLs 71 and the VSLs 73. It is apparent from the above that, in the solid-state imaging device 151, the load capacitance difference between the VSLs 71 and the VSLs 73 is reduced to 10%.

Figure 6:
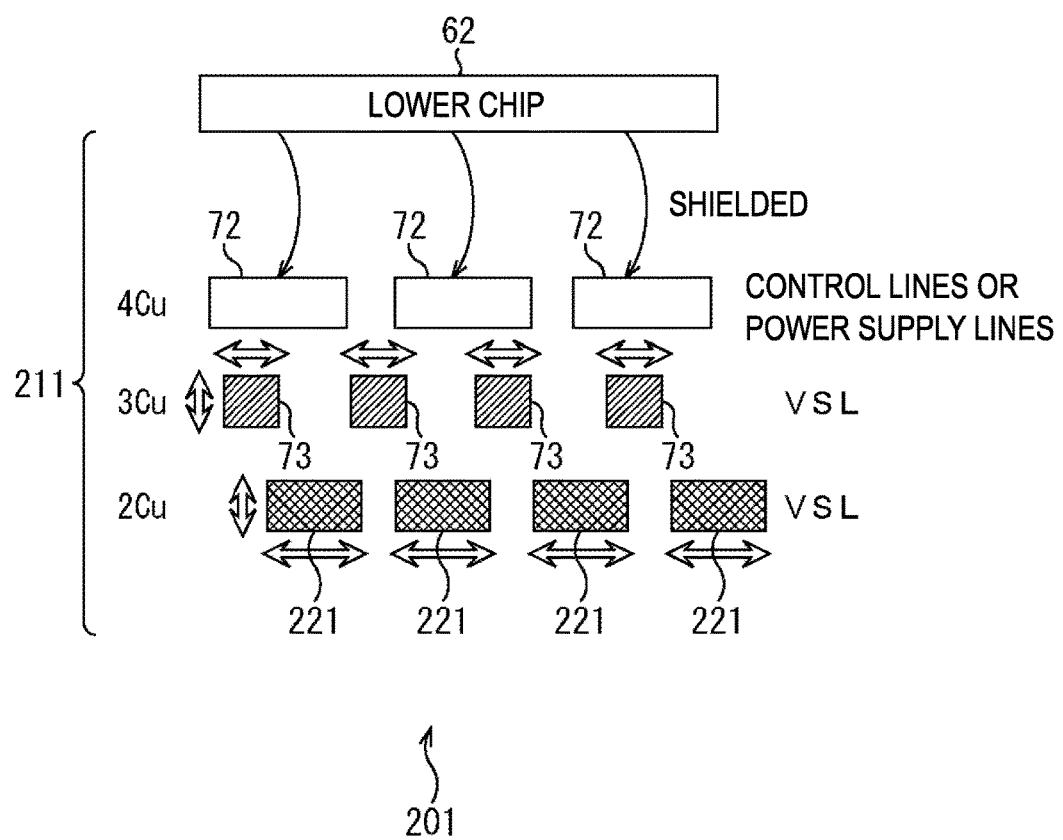
FIG. 6 is a cross-sectional view of a third example structure of a solid-state imaging device to which the present technology is applied.

Referring now to FIG. 6, another method of reducing a VSL load capacitance difference is described.

The solid-state imaging device 201 in FIG. 6 is the same as the solid-state imaging device 101 in FIG. 3 in including the lower chip 62. The solid-state imaging device 201 in FIG. 6 differs from the solid-state imaging device 101 in FIG. 3 in that the upper chip 161 is replaced with an upper chip 211.

In the upper chip 211, VSLs 221, VSLs 73, and control lines 72 are stacked in this order from the bottom. Specifically, the VSLs 221 differ in size from the VSLs 73 in FIG. 3.

In this manner, the VSL load capacitance difference between the VSLs 73 laid out in the layer 3Cu and the VSLs 221 laid out in the layer 2Cu can be reduced by adjusting the widths and/or the thicknesses of the interconnect lines.

Figure 7:
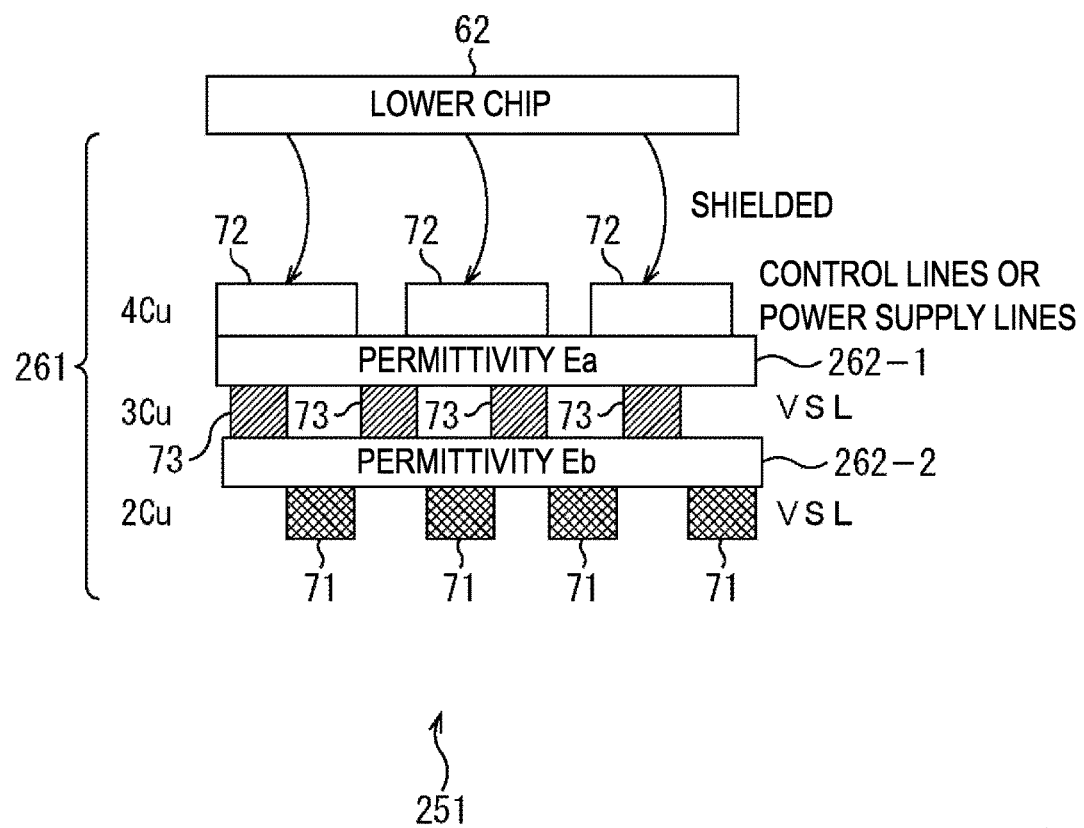
FIG. 7 is a cross-sectional view of a fourth example structure of a solid-state imaging device to which the present technology is applied.

Alternatively, the VSL load capacitance difference can be reduced by adjusting the permittivities of interlayer insulating films, as shown in FIG. 7.

The solid-state imaging device 251 in FIG. 7 is the same as the solid-state imaging device 101 in FIG. 3 in including the lower chip 62. The solid-state imaging device 201 in FIG. 6 differs from the solid-state imaging device 101 in FIG. 3 in that the upper chip 161 is replaced with an upper chip 261, and interlayer insulating films 262-1 and 262-2 having different permittivities from each other are added.

Specifically, the interlayer insulating film 262-1 having a permittivity Ea is added between the control lines 72 in the layer 4Cu and the VSLs 73 in the layer 3Cu, and the interlayer insulating film 262-2 having a permittivity Eb is added between the VSLs 71 in the layer 2Cu and the VSLs 73 in the layer 3Cu.

For example, adjustment is performed so that the permittivity Eb of the interlayer insulating film 262-2 at a greater distance (or farther away) from the control lines 72 becomes lower than the permittivity Ea of the interlayer insulating film 262-1 at a smaller distance from (or closer to) the control lines 72. That is, adjustment is made so that Eb>Ea.

In this manner, the VSL load capacitance difference between the VSLs 73 laid out in the layer 3Cu and the VSLs 71 laid out in the layer 2Cu can be reduced by adjusting the permittivities of the interlayer insulating films.

In a case where there are three or more layers of VSLs, the VSL load capacitance(s) difference can be reduced in the same manner as in any of the cases where there are two VSL layers as described above with reference to FIGS. 4, 6, and 7.

Figure 8:
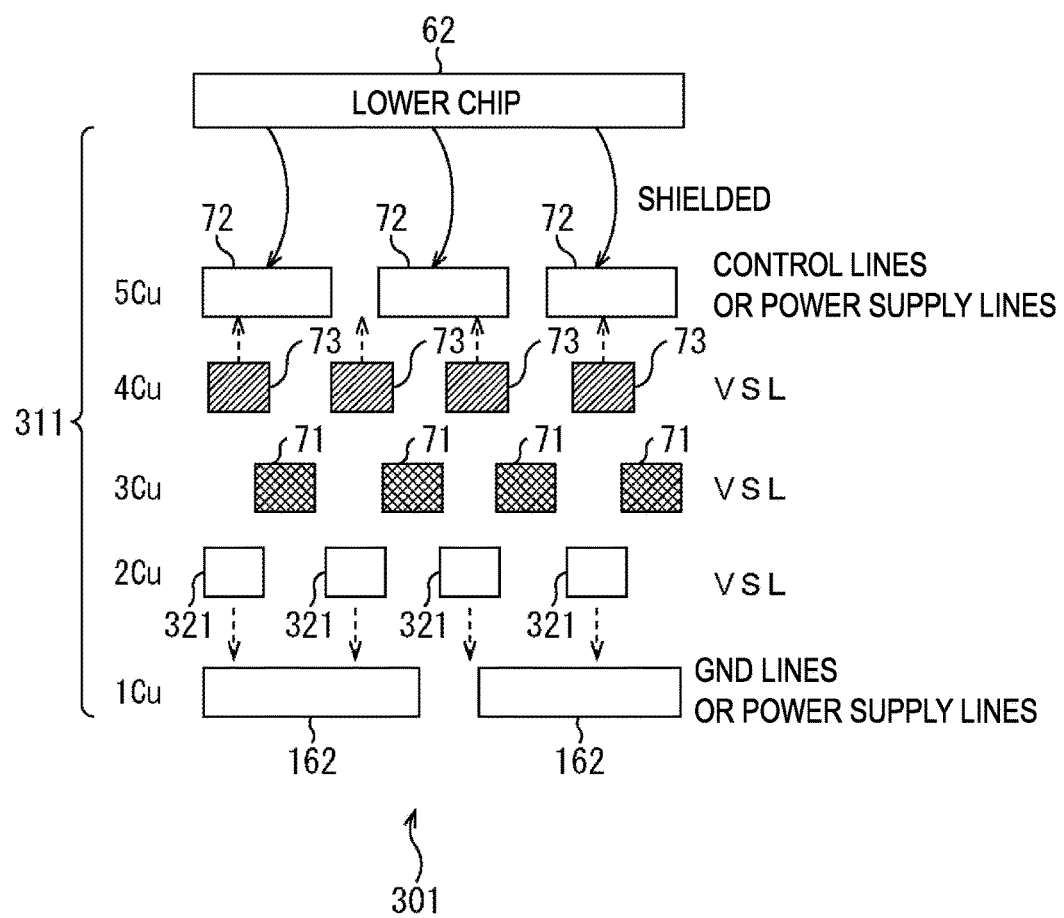
FIG. 8 is a cross-sectional view of a fifth example structure of a solid-state imaging device to which the present technology is applied.

FIG. 8 is a cross-sectional view of an example structure of a solid-state imaging device to which the present technology is applied.

The upper chip 311 of the solid-state imaging device 301 in FIG. 8 is the same as the upper chip 161 of the solid-state imaging device 151 in FIG. 4 in that VSLs 71, VSLs 73, and control lines 72 are stacked in this order from the bottom, and interconnect lines 162 are further laid out below the VSLs 71. The upper chip 311 of the solid-state imaging device 301 in FIG. 8 differs from the upper chip 161 of the solid-state imaging device 151 in FIG. 4 in that VSLs 321 are further added between the VSLs 71 and the interconnect lines 162.

That is, in the upper chip 311, the interconnect lines 162, the VSLs 321, the VSLs 71, the VSLs 73, and the control lines 72 are stacked, in this order from the bottom, as the layers 1Cu through 5Cu.

With this structure, the VSL load capacitance difference(s) can be reduced in the same manner as in the example shown in FIG. 4.

Figure 9:
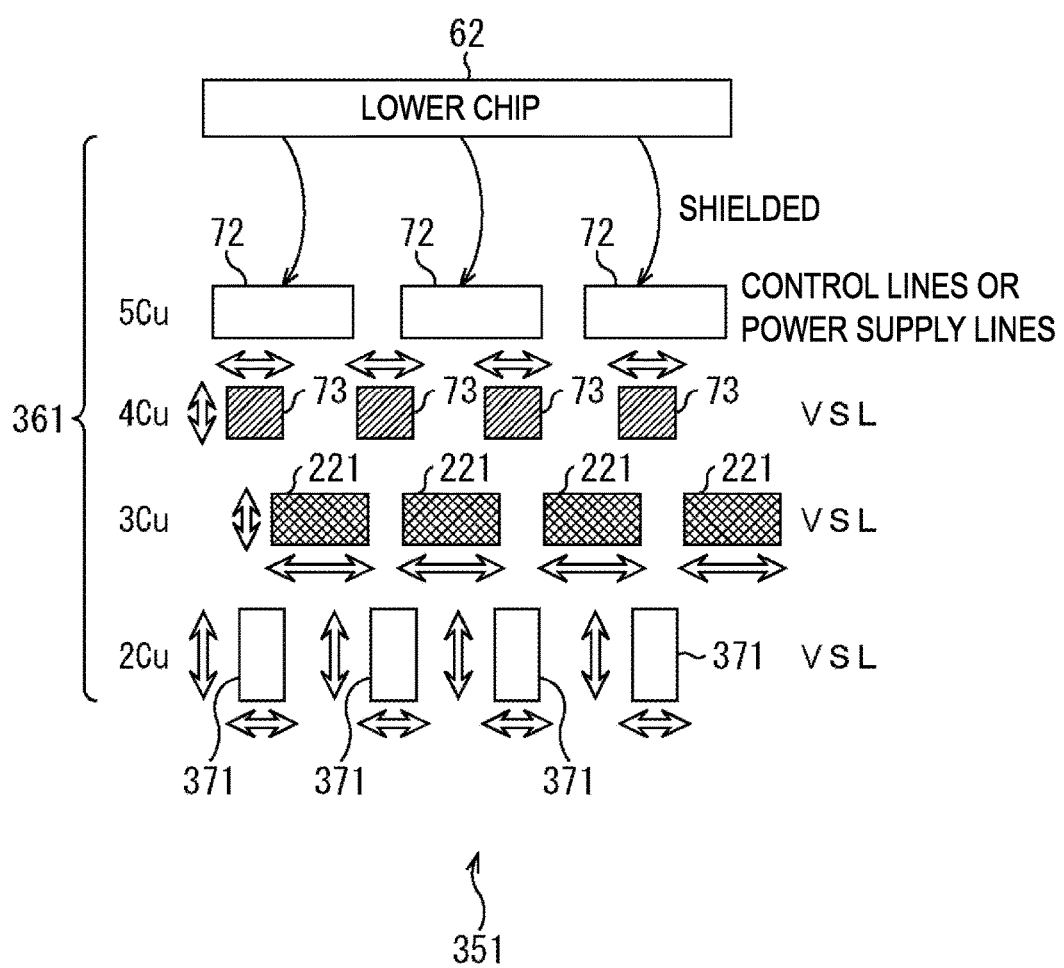
FIG. 9 is a cross-sectional view of a sixth example structure of a solid-state imaging device to which the present technology is applied.

FIG. 9 is a cross-sectional view of an example structure of a solid-state imaging device to which the present technology is applied.

The upper chip 361 of the solid-state imaging device 351 in FIG. 9 is the same as the upper chip 211 of the solid-state imaging device 201 in FIG. 6 in that VSLs 221, VSLs 73, and control lines 72 are stacked in this order from the bottom. The upper chip 361 of the solid-state imaging device 351 in FIG. 9 differs from the upper chip 211 of the solid-state imaging device 201 in FIG. 6 in that VSLs 371 are further added immediately below the VSLs 221.

In the upper chip 361 in FIG. 9, not only the VSLs 221 but also the VSLs 371 differ in size from the VSLs 73 in FIG. 3.

In this manner, the VSL load capacitance difference(s) among the VSLs 73 laid out in the layer 4Cu, the VSLs 221 laid out in the layer 3Cu, and the VSLs 371 laid out in the layer 2Cu can be reduced by adjusting the widths and/or the thicknesses of the interconnect lines.

Figure 10:
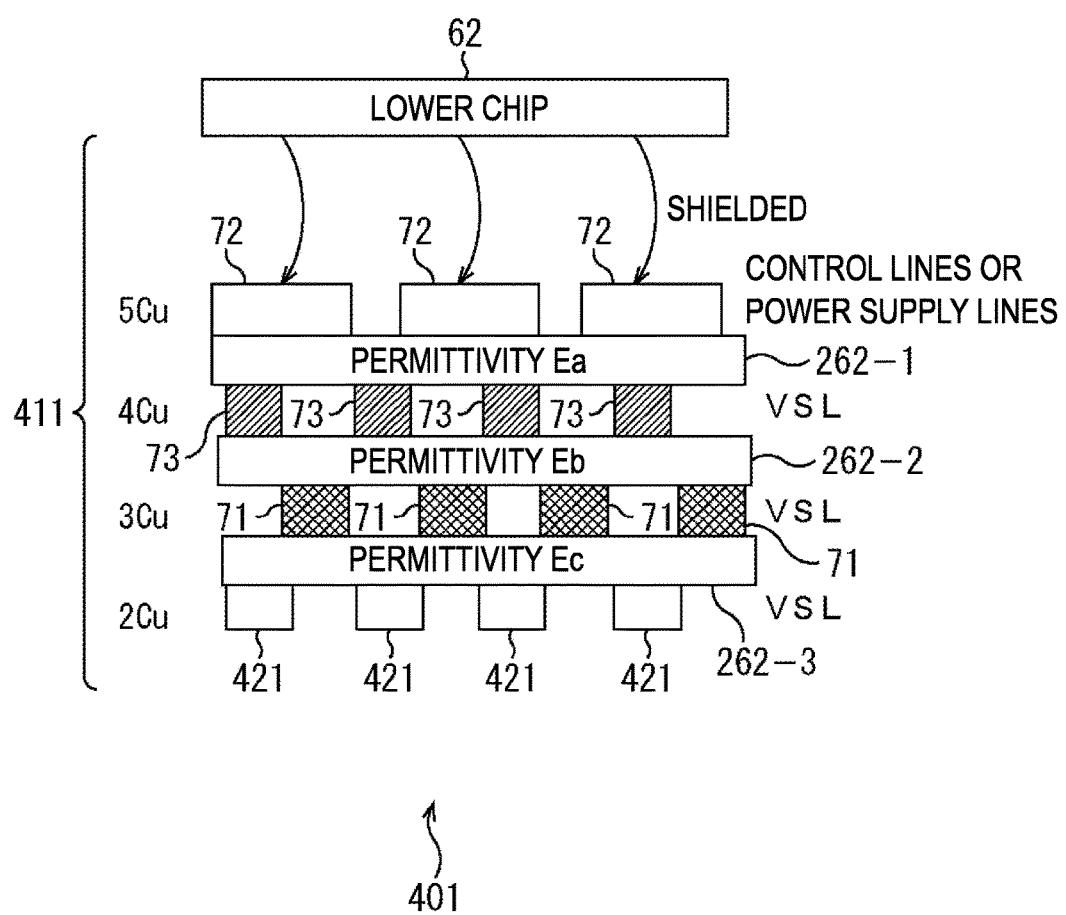
FIG. 10 is a cross-sectional view of a seventh example structure of a solid-state imaging device to which the present technology is applied.

FIG. 10 is a cross-sectional view of an example structure of a solid-state imaging device to which the present technology is applied.

The upper chip 411 of the solid-state imaging device 401 in FIG. 10 is the same as the upper chip 261 of the solid-state imaging device 251 in FIG. 7 in that VSLs 71, VSLs 73, and control lines 72 are stacked in this order from the bottom. The upper chip 411 of the solid-state imaging device 401 in FIG. 10 is also the same as the upper chip 261 of the solid-state imaging device 251 in FIG. 7 in that an interlayer insulating film 262-2 having a permittivity Eb is formed between the VSLs 71 and the VSLs 73, and an interlayer insulating film 262-1 having a permittivity Ea is formed between the VSLs 73 and the control lines 72.

The upper chip 411 of the solid-state imaging device 401 in FIG. 10 differs from the upper chip 261 of the solid-state imaging device 251 in FIG. 7 in that VSLs 421 are added in a layer under the VSLs 71, and an interlayer insulating film 262-3 having a permittivity Ec is further formed between the VSLs 71 and the VSLs 421.

Since the permittivity of an interlayer insulating film at a smaller distance from (or closer to) control lines 72 is adjusted to a smaller value, the permittivity relationship is adjusted to Ec>Eb>Ea.

In this manner, the VSL load capacitance difference(s) among the VSLs 421 laid out in the layer 2Cu, the VSLs 71 laid out in the layer 3Cu, and the VSLs 73 laid out in the layer 4Cu can be reduced by adjusting the permittivities of the interlayer insulating films.

In the above described examples, the imaging elements included in the chips are back-illuminated imaging elements. However, front-illuminated imaging elements may also be used. Still, the influence of crosstalk is larger on back-illuminated imaging elements, and greater effects can be expected with back-illuminated imaging elements.

Applications of the present technology are not limited to solid-state imaging devices, such as image sensors. Specifically, the present technology can be applied to any electronic apparatus using a solid-state imaging device as an image capturing unit (a photoelectric conversion unit), such as an imaging apparatus like a digital still camera or a video camera, a mobile terminal device having an imaging function, or a copying machine using a solid-state imaging device as the image reader.

2. Second Embodiment

<Example Structure of an Electronic Apparatus>

Figure 11:
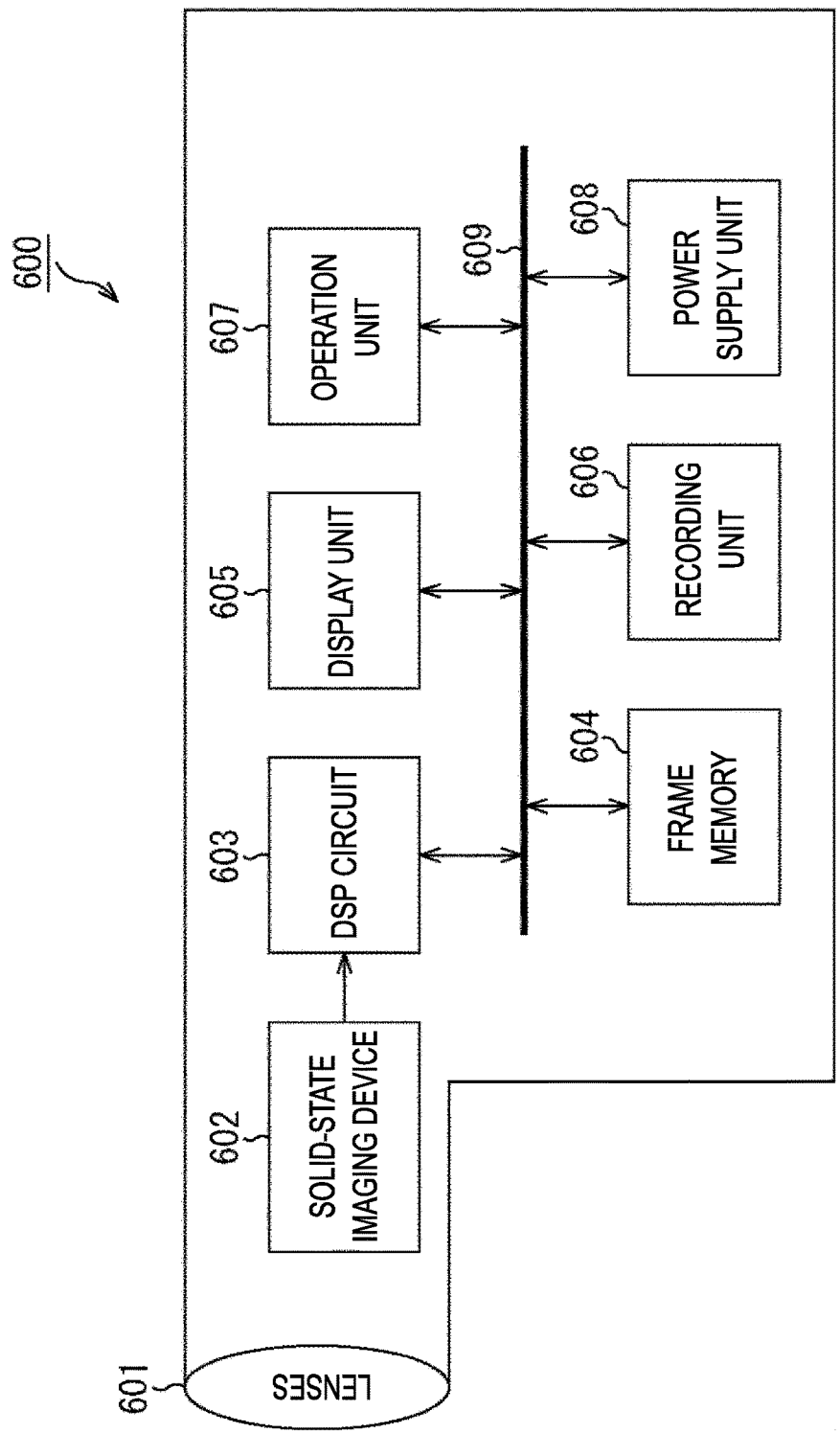
FIG. 11 is a block diagram showing an example structure of an electronic apparatus to which the present technology is applied.

FIG. 11 is a block diagram showing an example structure of a camera apparatus as an electronic apparatus to which the present technology is applied.

The camera apparatus 600 in FIG. 11 includes an optical unit 601 formed with lenses and the like, a solid-state imaging device (an imaging device) 602 having the respective components of the above described pixels 2, and a DSP circuit 603 that is a camera signal processing circuit. The camera apparatus 600 also includes a frame memory 604, a display unit 605, a recording unit 606, an operation unit 607, and a power supply unit 608. The DSP circuit 603, the frame memory 604, the display unit 605, the recording unit 606, the operation unit 607, and the power supply unit 608 are connected to one another via a bus line 609.

The optical unit 601 gathers incident light (image light) from an object and forms an image on the imaging surface of the solid-state imaging device 602. The solid-state imaging device 602 converts the amount of the incident light, which has been gathered as the image on the imaging surface by the optical unit 601, into an electrical signal for each pixel, and outputs the electrical signal as a pixel signal. A solid-state imaging device according to any of the above described embodiments can be used as the solid-state imaging device 602. With this structure, crosstalk interference can be reduced, and accordingly, a high-performance electronic apparatus can be provided.

The display unit 605 is formed with a panel display device such as a liquid crystal panel or an organic electro-luminescence (EL) panel, and displays a moving image or a still image formed by the solid-state imaging device 602. The recording unit 606 records a moving image or a still image formed by the solid-state imaging device 602 on a recording medium, such as a video tape or a digital versatile disk (DVD).

When operated by a user, the operation unit 607 issues operating instructions as to various functions of the camera apparatus 600. The power supply unit 608 supplies various power sources as the operation power sources for the DSP circuit 603, the frame memory 604, the display unit 605, the recording unit 606, and the operation unit 607, as appropriate.

It should be noted that embodiments of the present disclosure are not limited to the above described embodiments, and various modifications may be made to them without departing from the scope of the present disclosure.

Furthermore, any structure described above as one device (or one processing unit) may be divided into two or more devices (or processing units). Conversely, any structure described above as two or more devices (or processing units) may be combined into one device (or processing unit). Furthermore, it is of course possible to add components other than those described above to the structure of any of the devices (or processing units). Furthermore, some components of a device (or a processing unit) may be incorporated into the structure of another device (or a processing unit) as long as the structure and the function of the system as a whole are substantially the same. That is, the present technology is not limited to the embodiments described above, but various modifications may be made to them without departing from the scope of the technology.

While preferred embodiments of the present disclosure have been described above with reference to the accompanying drawings, the present disclosure is not limited to those examples. It is apparent that those who have ordinary skills in the art can make various changes or modifications within the scope of the technical spirit claimed herein, and it should be understood that those changes or modifications are within the technical scope of the present disclosure.

The present technology can also be in the following forms.

(1) A solid-state imaging device including:
a pixel chip; and
a logic chip stacked on the pixel chip,
wherein, in the pixel chip, first interconnect lines are laid out in a layer above vertical signal lines, the first interconnect lines being other than the vertical signal lines.

(2) The solid-state imaging device of (1), wherein the vertical signal lines are laid out in two or more layers.

(3) The solid-state imaging device of (2), wherein second interconnect lines are laid out in a layer below vertical signal lines in the lowermost layer among the vertical signal lines, the second interconnect lines being other than the vertical signal lines.

(4) The solid-state imaging device of (2), wherein the vertical signal lines laid out in the two or more layers differ in at least one of line width and thickness.

(5) The solid-state imaging device of any of (1) through (4), further including interconnect interlayer insulating films having different permittivities.

(6) The solid-state imaging device of (5), wherein the permittivities are adjusted in accordance with distances from the logic chip.

(7) The solid-state imaging device of (6), wherein the permittivity at a greater distance from the logic chip is adjusted to a greater value.

(8) The solid-state imaging device of any of (1) through (7), which is formed with a back-illuminated imaging device.

(9) The solid-state imaging device of any of (1) through (8), wherein the first interconnect lines are control lines, ground lines, or power supply lines.

(10) The solid-state imaging device of any of (3) through (8), wherein the second interconnect lines are ground lines or power supply lines.

(11) An electronic apparatus including:
a solid-state imaging device including:
a pixel chip; and
a logic chip stacked on the pixel chip,
in the pixel chip, first interconnect lines being laid out in a layer above vertical signal lines, the first interconnect lines being other than the vertical signal lines;
a signal processing circuit that processes a signal output from the solid-state imaging device; and
an optical system that emits light entering the solid-state imaging device.

(12) The electronic apparatus of (11), wherein the vertical signal lines are laid out in two or more layers.

(13) The electronic apparatus of (12), wherein second interconnect lines are laid out in a layer below vertical signal lines in the lowermost layer among the vertical signal lines, the second interconnect lines being other than the vertical signal lines.

(14) The electronic apparatus of (12), wherein the vertical signal lines laid out in the two or more layers differ in at least one of line width and thickness.

(15) The electronic apparatus of any of (11) through (14), further including interconnect interlayer insulating films having different permittivities. (16) The electronic apparatus of (15), wherein the permittivities are adjusted in accordance with distances from the logic chip.

(17) The electronic apparatus of (16), wherein the permittivity at a greater distance from the logic chip is adjusted to a greater value.

(18) The electronic apparatus of any of (11) through (17), wherein the solid-state imaging device is formed with a back-illuminated imaging device.

(19) The electronic apparatus of any of (11) through (18), wherein the first interconnect lines are control lines, ground lines, or power supply lines.

(20) The electronic apparatus of any of (13) through (18), wherein the second interconnect lines are ground lines or power supply lines.

REFERENCE SIGNS LIST

1 Solid-state imaging device
62 Lower chip
71 VSL
72 Control line
73 VSL
101 Solid-state imaging device
111 Upper chip
151 Solid-state imaging device
161 Upper chip
162 Interconnect line
201 Solid-state imaging device
211 Upper chip
221 VSL
251 Solid-state imaging device
261 Upper chip
262-1 to 262-3 Interlayer insulating film
301 Solid-state imaging device
311 Upper chip
321 VSL
351 Solid-state imaging device
361 Upper chip
371 VSL
401 Solid-state imaging device
411 Upper chip
421 VSL
600 Camera apparatus
601 Optical unit
602 Solid-state imaging device
603 DSP circuit

What is claimed is:

1. A solid-state imaging device comprising:
a pixel chip that generates pixel signals; and
a logic chip stacked on the pixel chip,
wherein the logic chip processes the pixel signals from the pixel chip,
wherein, in the pixel chip, first interconnect lines are laid out in a layer above vertical signal lines, the first interconnect lines being other than the vertical signal lines,
wherein the vertical signal lines are laid out in at least two layers including a first layer and a second layer,
wherein, in the pixel chip, second interconnect lines are laid out in a layer below vertical signal lines in the second layer that is below the first layer, the second interconnect lines being other than the vertical signal lines,
wherein at least one of the first interconnect lines overlaps at least one of the vertical signal lines in the first layer in a plan view,
wherein the vertical signal lines transmit the pixel signals to a column processing circuit,
wherein the first interconnect lines are control lines, ground lines, or power supply lines,
wherein the second interconnect lines are ground lines or power supply lines, wherein the pixel chip further comprises:
    a first interlayer insulating film between the first interconnect lines and the first layer of the vertical signal lines; and
    a second interlayer insulating film between the first layer of the vertical signal lines and the second layer of the vertical signal lines,
wherein the first layer of the vertical signal lines is closer to the logic chip than the second layer of the vertical signal lines, and
wherein a permittivity of the second interlayer insulating film is lower than a permittivity of the first interlayer insulating film.

2. The solid-state imaging device according to claim 1, wherein the vertical signal lines laid out in the at least two layers differ in at least one of line width and thickness.

3. The solid-state imaging device according to claim 1, which is formed with a back-illuminated imaging device.

4. The solid-state imaging device according to claim 1, wherein the pixel chip further comprises:
    a third interlayer insulating film below the second layer of the vertical signal lines, wherein a permittivity of the third interlayer insulating film is lower than the permittivity of the second interlayer insulating film.

5. The solid-state imaging device according to claim 1, wherein the at least one of the first interconnect lines overlaps at least one of the vertical signal lines in the second layer in the plan view.

6. The solid-state imaging device according to claim 1, wherein at least one of the second interconnect lines overlaps at least two of the vertical signal lines in the second layer in the plan view.

7. An electronic apparatus comprising:
    a solid-state imaging device including:
        a pixel chip that generates pixel signals; and
        a logic chip stacked on the pixel chip,
        wherein the logic chip processes the pixel signals from the pixel chip,
        wherein, in the pixel chip, first interconnect lines are laid out in a layer above vertical signal lines, the first interconnect lines being other than the vertical signal lines;
    a signal processing circuit configured to process a signal output from the solid-state imaging device; and
    an optical system configured to emit light entering the solid-state imaging device,
    wherein the vertical signal lines are laid out in at least two layers including a first layer and a second layer,
    wherein, in the pixel chip, second interconnect lines are laid out in a layer below vertical signal lines in the second layer that is below the first layer, the second interconnect lines being other than the vertical signal lines,
    wherein at least one of the first interconnect lines overlaps at least one of the vertical signal lines in the first layer in a plan view,
    wherein the vertical signal lines transmit the pixel signals to a column processing circuit,
    wherein the first interconnect lines are control lines, ground lines, or power supply lines,
    wherein the second interconnect lines are ground lines or power supply lines,
    wherein the pixel chip further comprises:
        a first interlayer insulating film between the first interconnect lines and the first layer of the vertical signal lines; and
        a second interlayer insulating film between the first layer of the vertical signal lines and the second layer of the vertical signal lines,
    wherein the first layer of the vertical signal lines is closer to the logic chip than the second layer of the vertical signal lines, and
    wherein a permittivity of the second interlayer insulating film is lower than a permittivity of the first interlayer insulating film.

8. The electronic apparatus according to claim 7, wherein the vertical signal lines laid out in the at least two layers differ in at least one of line width and thickness.

9. The electronic apparatus according to claim 7, wherein the solid-state imaging device is formed with a back-illuminated imaging device.

10. The electronic apparatus according to claim 7, wherein the pixel chip further comprises:
    a third interlayer insulating film below the second layer of the vertical signal lines, wherein a permittivity of the third interlayer insulating film is lower than the permittivity of the second interlayer insulating film.

11. The electronic apparatus according to claim 7, wherein the at least one of the first interconnect lines overlaps at least one of the vertical signal lines in the second layer in the plan view.

12. The electronic apparatus according to claim 7, wherein at least one of the second interconnect lines overlaps at least two of the vertical signal lines in the second layer in the plan view.

* * * * *